United States Patent [19]

Kratomi

[11] 3,999,106
[45] Dec. 21, 1976

[54] ELECTRICAL SWITCH DEVICE

[76] Inventor: Shunsei Kratomi, No. 456, Maegawa, Odawara, Kanagawa, Japan

[22] Filed: June 10, 1975

[21] Appl. No.: 585,491

[30] Foreign Application Priority Data

June 14, 1974 Japan .............................. 49-67189

[52] U.S. Cl. .......................... 317/151; 317/DIG. 8
[51] Int. Cl.² ........................................ H01H 47/00
[58] Field of Search ........ 317/151, DIG. 6, DIG. 8, 317/157, 123

[56] References Cited
UNITED STATES PATENTS

| | | | |
|---|---|---|---|
| 3,365,625 | 1/1968 | Pearse | 317/151 |
| 3,398,330 | 8/1968 | Poole | 317/151 X |

*Primary Examiner*—R. N. Envall, Jr.
*Attorney, Agent, or Firm*—Flynn & Frishauf

[57] ABSTRACT

An electrical switch device comprising a bi-stable double-throw switching relay having magnetic or mechanical means for contact holding, and at least one capacitive and/or inductive energy storing component to supply the switching relay with trailing edge trigger. The energy storing component is connected to a first contact of the relay, receives energy while the first contact is selected or reset and while the common contact of the relay is connected to a direct-current power source, and it discharges energy upon disconnecting the common contact from the power source so as to drive the relay, resulting in a second contact being selected. Such a switch device permits only the first pulse to reach the first relay contact after reset. A sequential switch apparatus for a two-wire line, connecting spread loads in either chain or tree wise fashion throughout a given system, may be realized by making use of the present switch devices wherein, for example, an operational sequence of turning on and off of power to the loads at the power source side according to a desired time schedule is required.

21 Claims, 49 Drawing Figures

Fig. 4    Fig. 5
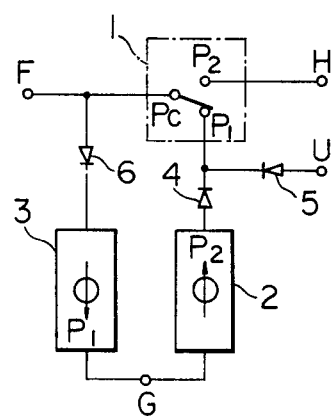
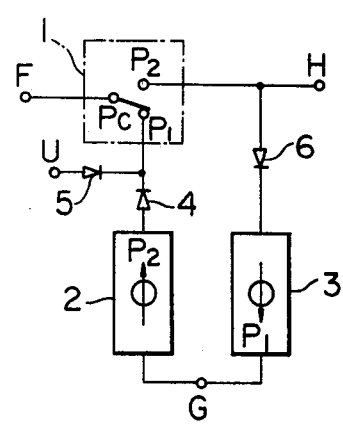
Fig. 6
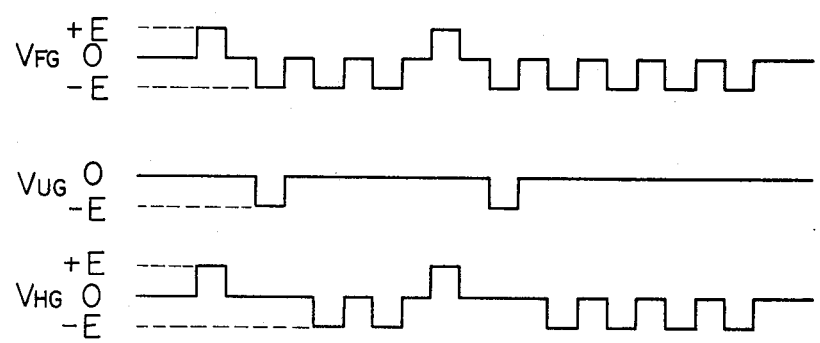

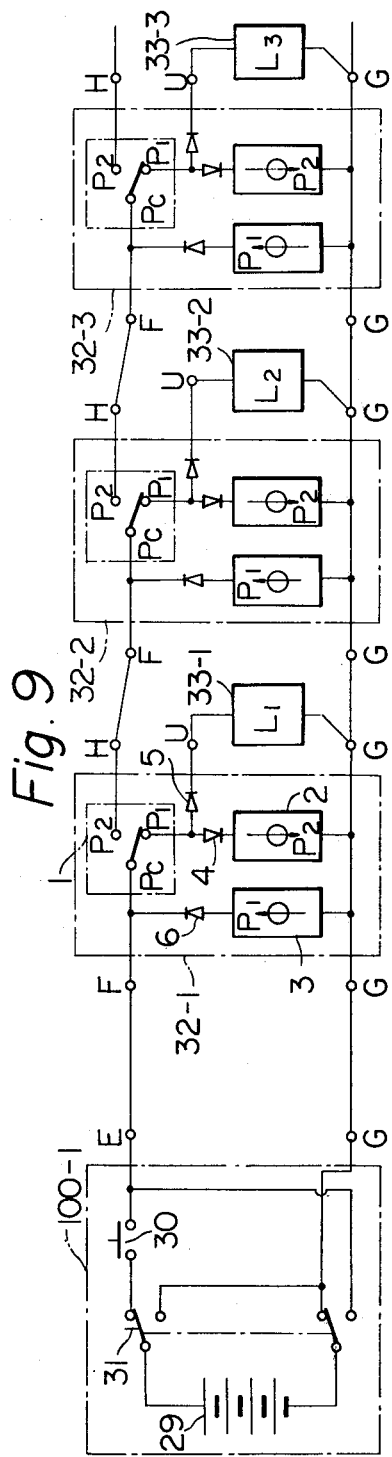
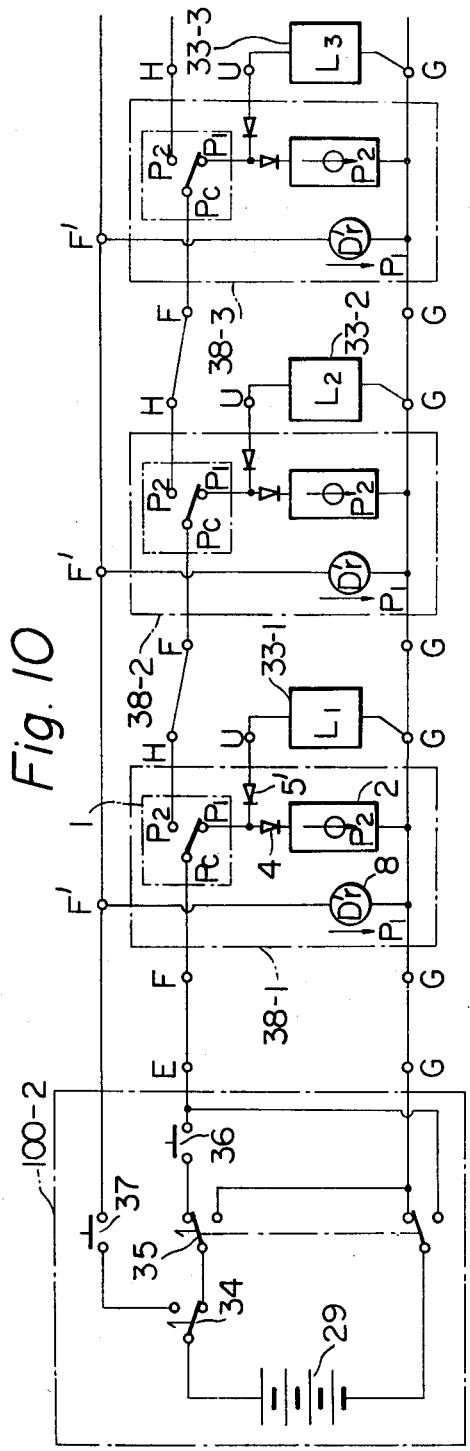
Fig. 9
Fig. 10

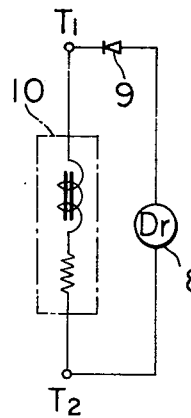
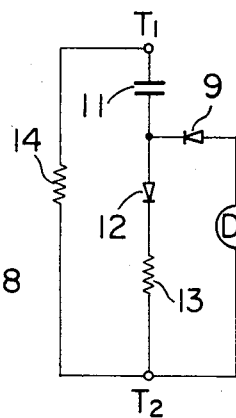
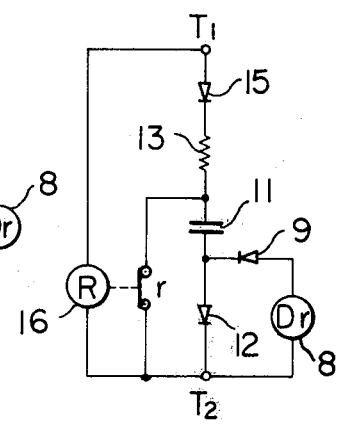
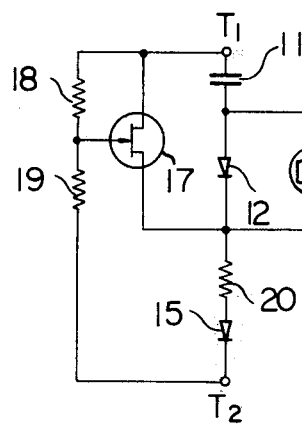
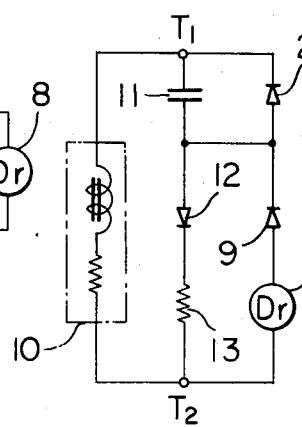
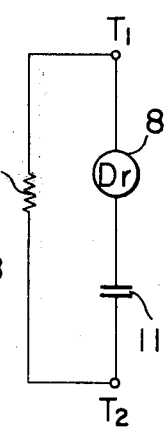

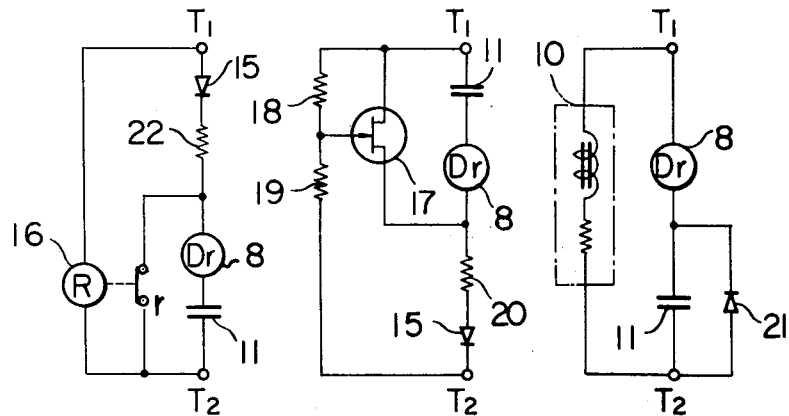
Fig. 17  Fig. 18  Fig. 19
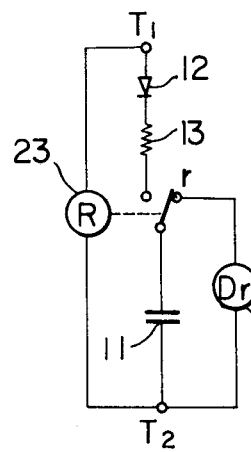
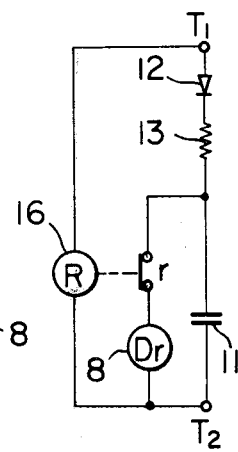
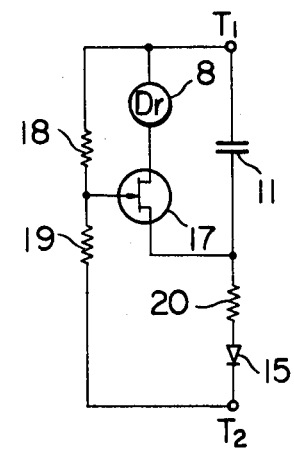
Fig. 20  Fig. 21  Fig. 22

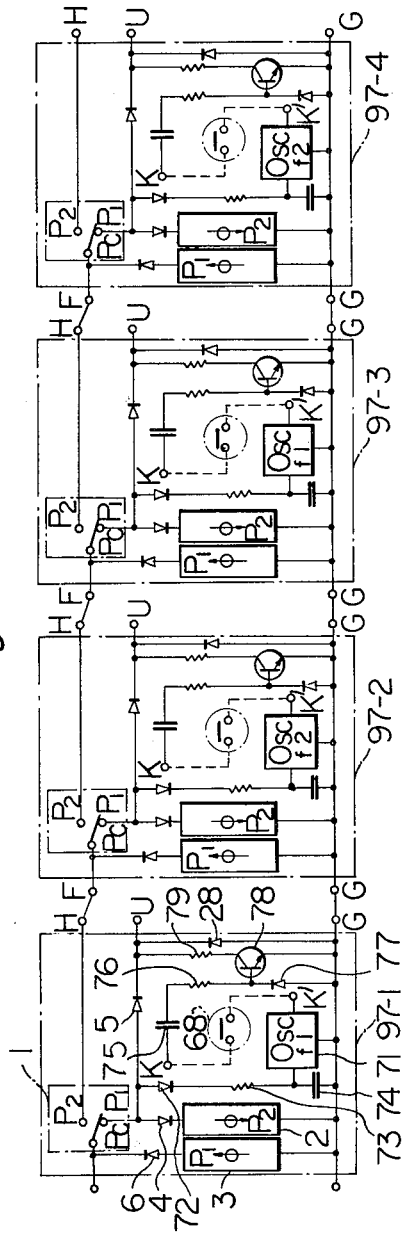
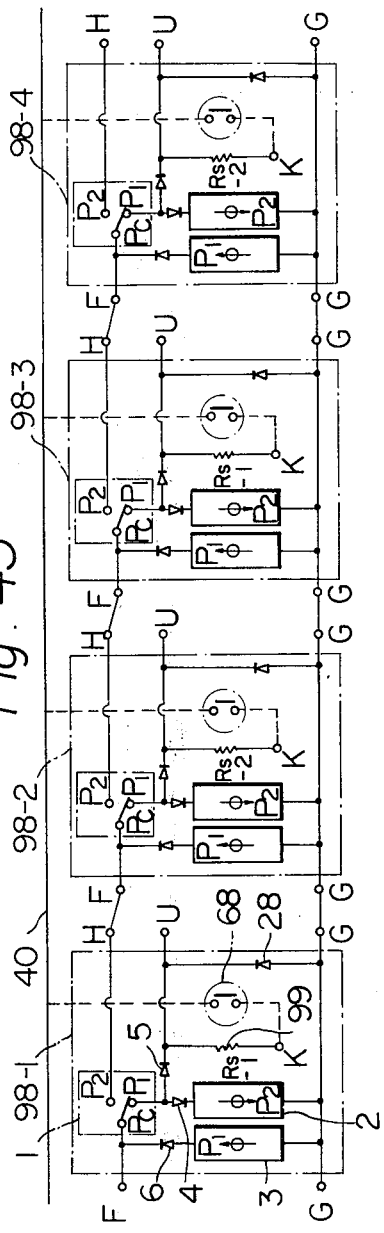
Fig. 42
Fig. 43

$t_0 < t_1 < t_1' < t_2 < t_2'$

ELECTRICAL SWITCH DEVICE

The present invention relates to electrical switch devices, and more particularly to sequential switch devices.

It is an object of the present invention to provide a switch apparatus particularly for use in sequential power distribution, in which the power system may have spread loads wired with two-wire line in either a chain or tree wise manner all over the system. The switch devices according to the present invention are to be used where many loads are scattered over a large area and are subject to sequential power supply and should involve minimized material and labor requirement for wiring.

It is a further object to provide such switches which require no highly skilled labor for operation and maintenance because of its simplified operation, and with which no special control signals are required.

SUMMARY OF THE INVENTION

A switch device according to the present invention has one input and two exclusively selective output channels, and a trailing-edge-triggered drive circuit which is connected to a first contact of a switching relay together with a first output channel to perform change-over of the relay from the first relay contact to a second relay contact. Only the first input pulse is permitted to reach the first output channel and all the pulses in succession are fed to the second output channel until change-over from the second relay contact back to the first relay contact takes place. On-off operation of the power supply effects switching in the "set mode", thus eliminating the requirement for any special signal, and change-over from the second to the first relay contact may be effected by reversing the polarity of the voltage applied to the input channel.

Briefly, in accordance with the present invention, the electrical switch device comprises a bi-stable double-throw switching relay having non-galvanic memory means for the two exclusively selective relay contacts and at least one capacitive or inductive element or one combination of capacitive and inductive elements having sufficient energy storage capacity for driving the switching relay. A typical switching relay that fulfills the above requirements may be, for example, a latching relay having magnetic or mechanical means for contact holding. The energy storing component may be, for example, a capacitor, an electromagnet or solenoid, or a combination thereof.

The energy storing component, being incorporated in a drive circuit of the switching relay, is connected to a first contact of the relay such that it is charged with energy during a period when the first relay contact is selected or switched on and when the common contact of the relay is coupled to a direct-current power source. The energy storing component is connected in the drive circuit of the relay so that it discharges and delivers the stored energy to the relay so as to perform a change-over from the first relay contact to a second relay contact when the common contact of the relay is turned off from the power source.

Thus, the switch device is provided with a trailing-edge-triggered drive circuit for causing change-over from a first to a second relay contact and has a novel and useful characteristic of operation whereby only the first pulse, delivered to the input terminal of the switch device and to the common contact of the relay in turn, is permitted to reach the first contact of the relay and to a first output channel in turn, all the pulses in succession being coupled to a second contact of the relay and a second output channel in turn until a subsequent change-over from the second relay contact to the first relay contact is performed.

Taking advantage of this characteristic, a sequential switch apparatus of the present invention is particularly useful with a two-wire line that connects a large number of scattered loads in chain or tree wise fashion, as will become more apparent from the detailed description hereinbelow.

BRIEF DESCRIPTION OF THE DRAWINGS

FIGS. 1, 2, 4, 5, 7a, 7b, 8a, 8b, 27, to 32, 34 to 37, 40, 41, 44 and 46 are schematic circuit diagrams of various embodiments of switch devices in accordance with the present invention;

FIG. 6 shows voltage vs. time waveforms corresponding to operation of the embodiments of FIGS. 4 and 5;

FIGS. 11 to 26 are schematic circuit diagrams of various embodiments of trailing-edge-triggered drive circuits in accordance with the present invention;

FIGS. 9, 10, 42 and 43 are schematic circuit diagrams of embodiments of the sequential switch apparatus wired in a chain wise manner according to the present invention;

DETAILED DESCRIPTION OF ILLUSTRATED EMBODIMENTS

Figures 1, 2:
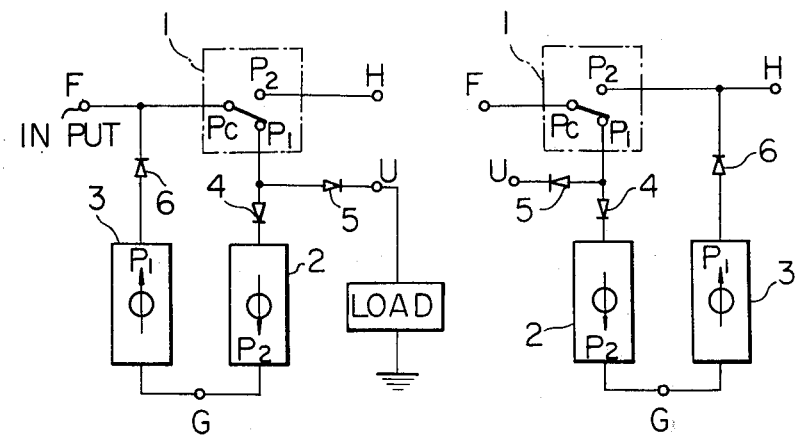

A new symbol of a circuit component is introduced in the drawings for convenience of illustration — that is, a combination of an arrow passing through a small circle, both of which are placed in a rectangle. This new symbol, designated with reference numerals 2 and 3 in FIGS. 1 and 2, for example, is used to indicate a trailing-edge-triggered drive circuit of a switching relay. A letter P with a subscript 1 or 2, being pointed at by the arrow, designates the relay contact to be switched on when an externally applied voltage of polarity as indicated by the arrow has been removed or disconnected.

Referring now to the drawings, and in particular to FIG. 1, a bi-stable double-throw switching relay has a set of contacts 1 which includes two exclusively selective contacts of which a first contact is $P_1$, a second contact is $P_2$ and the common contact is Pc. The switching relay may have two separate drive elements such as relay coils which are incorporated respectively in trailing-edge-triggered drive circuits 2 and 3. The details of typical trailing-edge-triggered drive circuits are described later with reference to FIGS. 11–26.

A first trailing-edge-triggered drive circuit 2 is connected to the first relay contact $P_1$ through diode 4 such that it is energized when positive voltage is applied thereto, and a second trailing-edge-triggered drive circuit 3 is connected to the common relay contact Pc and an input terminal F through diode 6 such that it is energized when negative voltage is applied thereto. An electrical load may be connected to a first output terminal U which is connected to first relay contact $P_1$ through a diode 5 that prevents the load from being energized when negative voltage is applied. A second output terminal H is connected to the second relay contact $P_2$. Terminal G is a common or ground terminal.

The circuit of FIG. 2 is different from that of FIG. 1 only in that the second trailing-edge-triggered drive circuit 3 is connected to the second relay contact $P_2$ and to the second output terminal H.

Various embodiments of trailing-edge-triggered drive circuits will be described in detail hereinbelow with reference to FIGS. 11 to 26.

Figure 3:
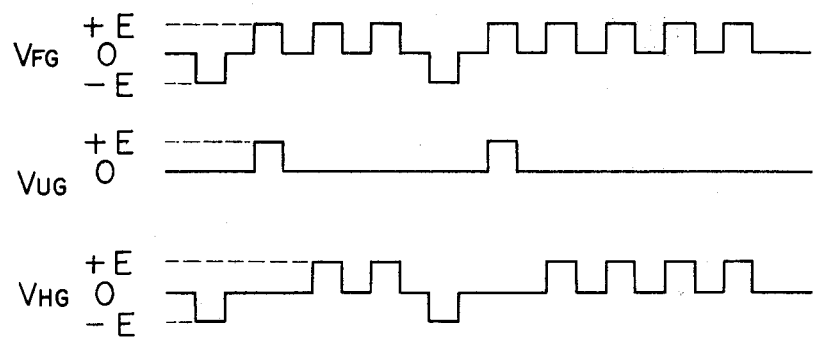
FIGS. 3 shows voltage vs. time waveforms corresponding to operation of the embodiments of FIGS. 1 and 2.

The operational characteristic of both the circuits of FIGS. 1 and 2 are shown by waveforms in FIG. 3 in which $V_{FG}$ is the voltage signal applied at terminal F, $V_{UG}$ is the voltage signal appearing at output terminal U, and $V_{HG}$ is the voltage signal appearing at output terminal H. The characteristic illustrated in FIG. 3 has a feature that only the first applied positive pulse is permitted to appear at output terminal U and all other positive pulses in succession appear at output terminal H after negative voltage is applied to input terminal F for reset. Further, only the first negative pulse is permitted to appear at output terminal H after a positive voltage is once applied to input terminal F.

The circuits of FIGS. 4 and 5 are complementary to those of FIGS. 1 and 2, respectively, and wherein the polarity of the diodes 4 to 6 and of the drive circuits 2,3 is reversed. This structure results in the operational characteristic as shown in FIG. 6 representing reflected or complementary images of FIG. 3 with respect to voltage polarity.

Figure 7A:
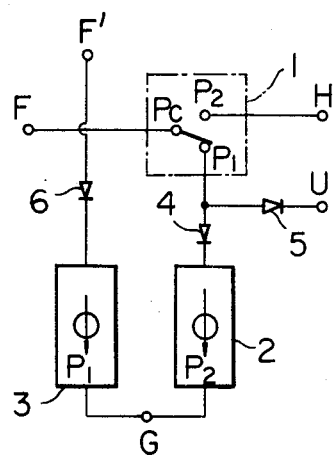
Figure 7B:
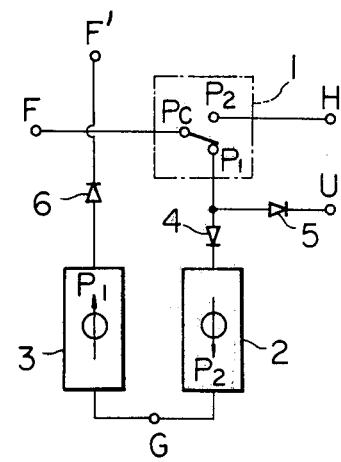

The circuits of FIGS. 7a and 7b are different from that of FIG. 1 only in that the trailing-edge-triggered drive circuit 3 for reset is not connected to the common contact Pc but is connected to a second input terminal F' such that the polarity of the reset input may be determined independently of the polarity of the input to the load. In FIG. 7a a positive pulse resets the device and in FIG. 7b a negative pulse is used for reset. In other respects the operation of these circuits is substantially similar to that of FIG. 1.

Figure 8A:
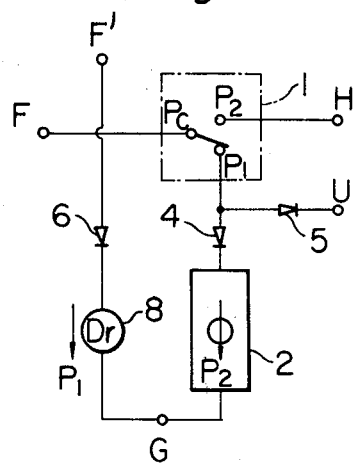
Figure 8B:
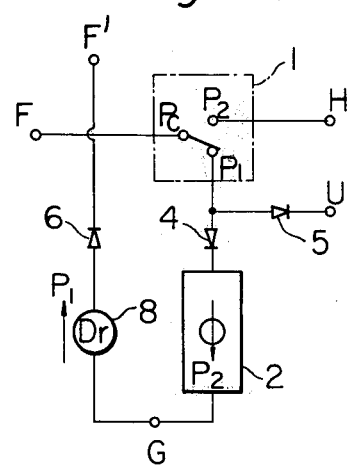

The circuits of FIGS. 8a and 8b are different from those of FIGS. 7a and 7b in that a drive element 8 of the switching relay replaces the trailing-edge-triggered drive circuit 3 for reset. Provision of the separate input terminal F' for reset permits this simplification. $P_1$ indicated by an arrow indicates that the relay switches from contact $P_2$ to contact $P_1$ when the drive element 8 is energized with a voltage of polarity as indicated by the arrow pointing to $P_1$.

FIGS. 9 and 10 show a sequential switch apparatus wired in a chain-wise manner as a typical application of the switch devices of the present invention.

In FIGS. 9 and 10, a plurality of switch devices are used and each switch device is connected one after another such that the second output terminal H of a given switch device is connected to the first input terminal F of the next switch device.

In FIG. 9 switch devices 32-1, 32-2 and 32-3 are identical and are of the type as shown in FIG. 1, and loads 33-1, 33-2 and 33-3 are connected to their first output terminals U, respectively. The state of the switch contacts 1 of the relays as illustrated in FIG. 9 show that "reset" has been accomplished. A power supply switch circuit 100-1 is coupled to the chain-wise connected switch devices as an input. The first MAKE of switch 30 in the power supply switch circuit 100-1 supplies the first load 33-1 with power from the direct-current power source 29, and the following BREAK of the same switch 30 causes change-over of the switch device 32-1. Likewise the second and third MAKEs of switch 30 supply loads 33-2 and 33-3 with power, respectively since successive positive pulses are fed out at terminals H (see FIG. 3). "Reset" is performed by operating change-over switch 31 which reverses the polarity of the voltage applied to input F of device 32-1 and provides a negative reset pulse which also appears on each output terminal H to reset the next switch device (see FIG. 3). Thus, sequential operation of many loads through a single two-wire line by simple ON-OFF operation of a power source is attained. Also simple reset of all the switch devices is attained.

In FIG. 10 switch devices 38-1, 38-2 and 38-3 are identical and are of the type as shown in FIG. 8a. Loads 33-1, 33-2 and 33-3 are respectively coupled to the switch devices so that they are sequentially operated. In this arrangement, ON-OFF operation of switch 36 in the power supply switch circuit 100-2 causes only sequential change-over of the switch devices. Change-over of switch 35 reverses the polarity of the voltage supplied to a load, but never causes change-over or set of the switch devices because of the opposite polarity of the applied voltage. This separation of change-over from power supply to the load is attained by provision of diode 5' having opposite polarity to diode 4. Reset is performed by means of change-over switch 34 and on-off switch 37 both of which must be operated to reset the switch devices.

Various embodiments of trailing-edge-triggered drive circuit for use in the embodiments of FIGS. 1, 2, 4, 5, 7a, 7b, 8a, 8b, 9 and 10 are shown in FIGS. 11-26. The circuit of FIG. 11 utilizes only an inductor 10 as the energy storing element; the circuits of FIGS. 12-14, 16-18, 20-23, 25 and 26 utilize only a capacitor 11 as the energy storing element; and the circuits of FIGS 15, 19 and 24 utilize a combination of an inductor 10 and a capacitor 11 as the energy storing element. The drive elements 8 (Dr) are, for example, a coil.

Referring to FIG. 11, diode 9 prevents drive element 8, such as a coil, of a switching relay from being energized while a positive external voltage is applied across terminals $T_1 - T_2$, and permits discharge current to flow from the energy storing element 10 (and/or 11 in FIGS. 12-26) to the drive element 8 when the external positive voltage has been removed from terminals $T_1 - T_2$. In FIG. 12, diode 12 blocks a charging current path when the external voltage has been removed from terminals $T_1 - T_2$, thus inhibiting discharge current from flowing back along said charging current path. Resistor 13 (FIG. 12) limits the amount of charging current through the capacitor 11. Resistor 14 (FIG. 12) being connected in the discharge current loop, limits the amount of bypass current when the external voltage is applied across terminals $T_1 - T_2$.

The embodiment of FIG. 13 includes a relay 16, the coil of which is coupled across terminals $T_1 - T_2$ and the normally closed contact r of which is connected across capacitor 11. The normally closed contact r of relay 16 breaks the discharge current loop when the external voltage is applied across terminals $T_1 - T_2$ which energized relay 16 to open contact r. Diode 15 blocks the charging current path so as to prevent capacitor discharge current from energizing relay 16.

As shown in FIG. 14, a field effect transistor (FET) 17, cooperating with resistors 18, 19 and 20, may take the place of relay 16 to provide similar operational effects.

In FIG. 15, a diode 21 is provided to protect capacitor 11, and which also permits discharge current from inductor 10 to flow. In FIG. 17, a resistor 22 is provided for protecting the normally closed relay contact r.

FIG. 16, 18 and 19 show various other modifications of the previously described circuits and the operation thereof should be apparent.

The embodiment of FIG. 20 comprises a relay 23 having a transfer contact r, shown in its "normal" position.

FIG. 21 is another embodiment using a relay 16 with a normally closed contact r in series with drive element 8, and FIG. 22 shows an FET circuit replacement for relay 16.

Figure 23:
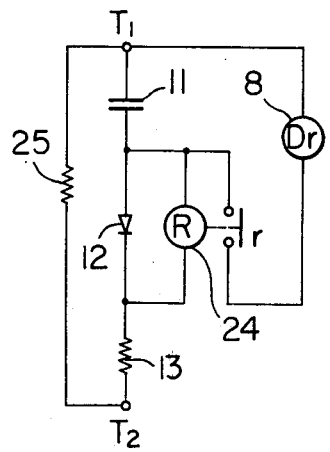
Figure 24:
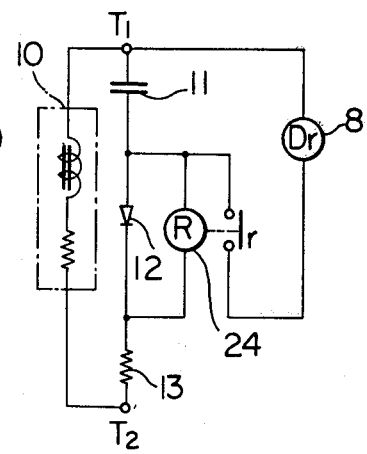
Figure 25:
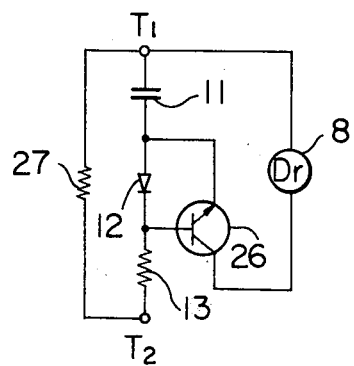
Figure 26:
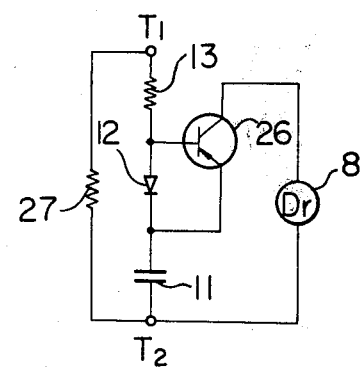

Th embodiment of FIG. 23 includes a relay 24 having a normally open contact r, which makes a discharge current loop so as to energize drive element 8 when the external voltage has been removed from terminals $T_1 - T_2$. Relay 24 shares energy stored in capacitor 11 with drive element 8 and needs its own discharge current loop that includes resistor 25. The circuit of FIG. 23 may be particularly useful where the coil impedance of relay 24 is much higher than that of drive element 8 because of reduced bypass current through resistor 25 when external voltage is applied across terminals $T_1 - T_2$. FIG. 24 shows a similar, but modified arrangement. FIGS. 25 and 26 show modified arrangements making use of a transistor 26 in place of relay 24 and resulting in sufficiently high impedance of resistor 27.

FIGS. 27 to 37 show typical switching devices using various ones of the trailing-edge-triggered drive circuits as shown in FIGS. 11 to 26 so as to form useful embodiments of a switch device in accordance with the present invention.

Figure 27:
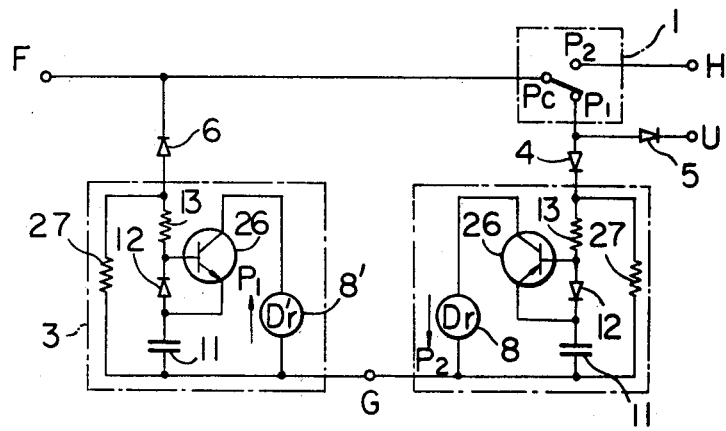

FIG. 27 illustrates the general circuit of FIG. 1, but showing details of typical drive circuits 2 and 3 for use therein. In the switch device of FIG. 27 the switching relay has contacts 1 and has two separate drive elements or coils 8 and 8'. Drive circuits of FIGS. 25 and 26 are selected to serve as drive circuits 3 and 2, respectively.

Figure 28:
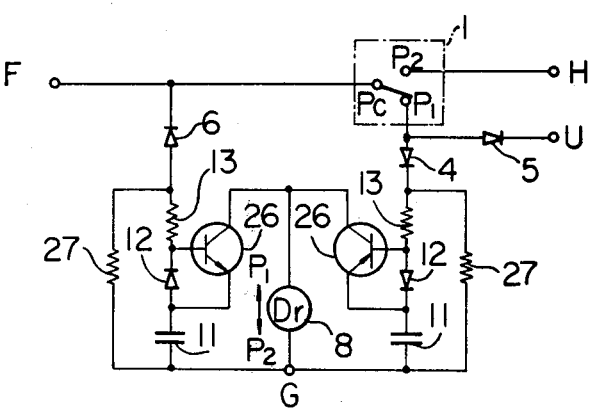

The switch device of FIG. 28 is similar to that of FIG. 27, but the switching relay has only a single drive element 8 of dual polarities. Again, the complementary drive circuits of FIGS. 25 and 26 are selected for circuits 3 and 2, respectively.

Figure 29:
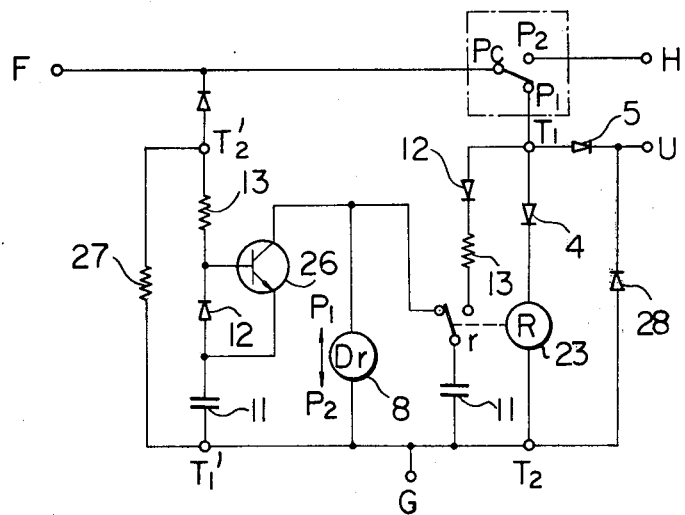

In the switch device of FIG. 29, based on that of FIG. 1, drive circuits of FIGS. 20 and 25 are selected for circuits 2 and 3, respectively so as to incorporate a switching relay having single drive element 8 of dual polarities. Diode 28 is a spark quencher.

Figure 30:
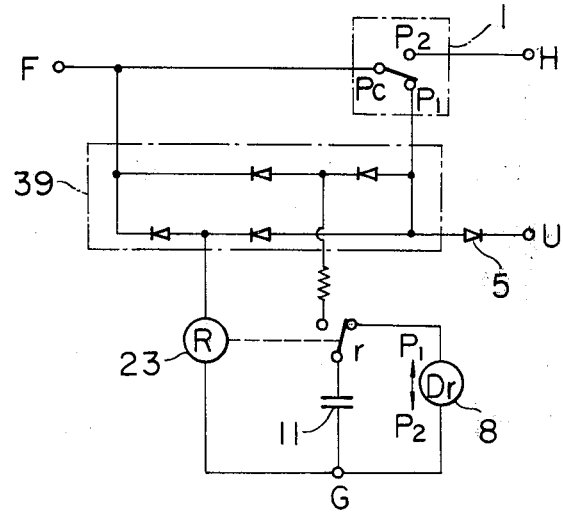

In the switch device of FIG. 30, a single drive circuit of FIG. 20, incorporating a switching relay having a single drive element 8 of dual polarities cooperates with a full-wave recitifer 39 so as to perform two-way change-over according to the polarity of the applied voltage to terminal F.

Figure 31:
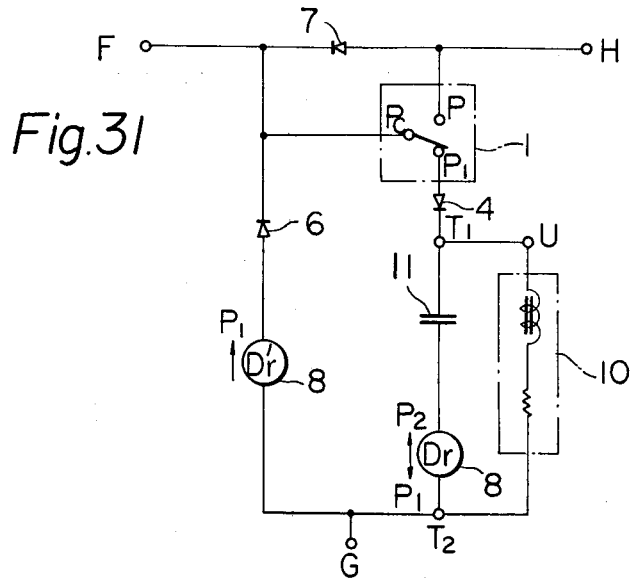

In the switch device of FIG. 31 a drive circuit of FIG. 19 is selected, but with diode 21 omitted. Reset may be performed by leading-edge-trigger provided that diode 7 provides one-way signal path from terminal H to terminal F. Inductor 10 may be a solenoid or an electromagnet of a load.

Figure 32:
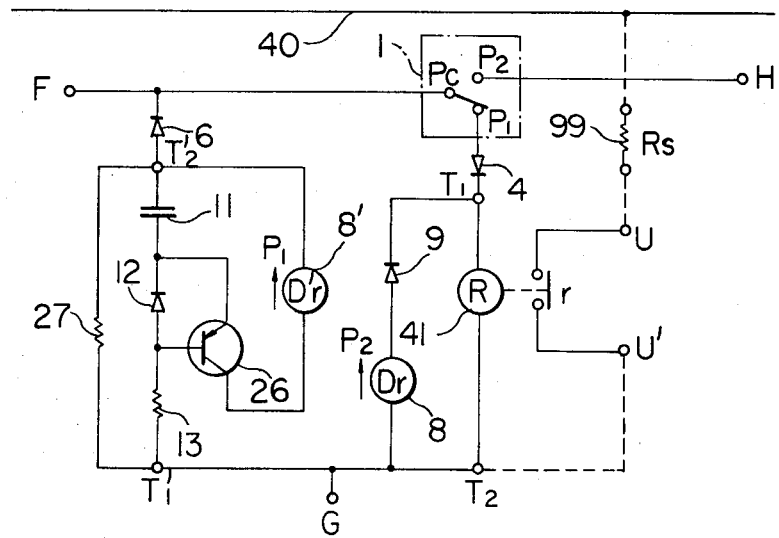

In the switch device of FIG. 32 drive circuits of FIGS. 11 and 26 are selected. The coil of relay 41 serves as the energy storing element 10 of FIG. 11 and stores and discharges energy so as to drive the switching relay by trailing-edge-trigger. The relay 41 has a normally open contact r. FIG. 32 indicates that switch devices of the present invention may facilitate remote sequential measurement through a single three-wire line without requiring coded signals. If the dashed line connection is externally wired, the "standard" resistor 99 is connected to a third line 40 via normally open contact r when relay 41 is energized.

Figure 33:
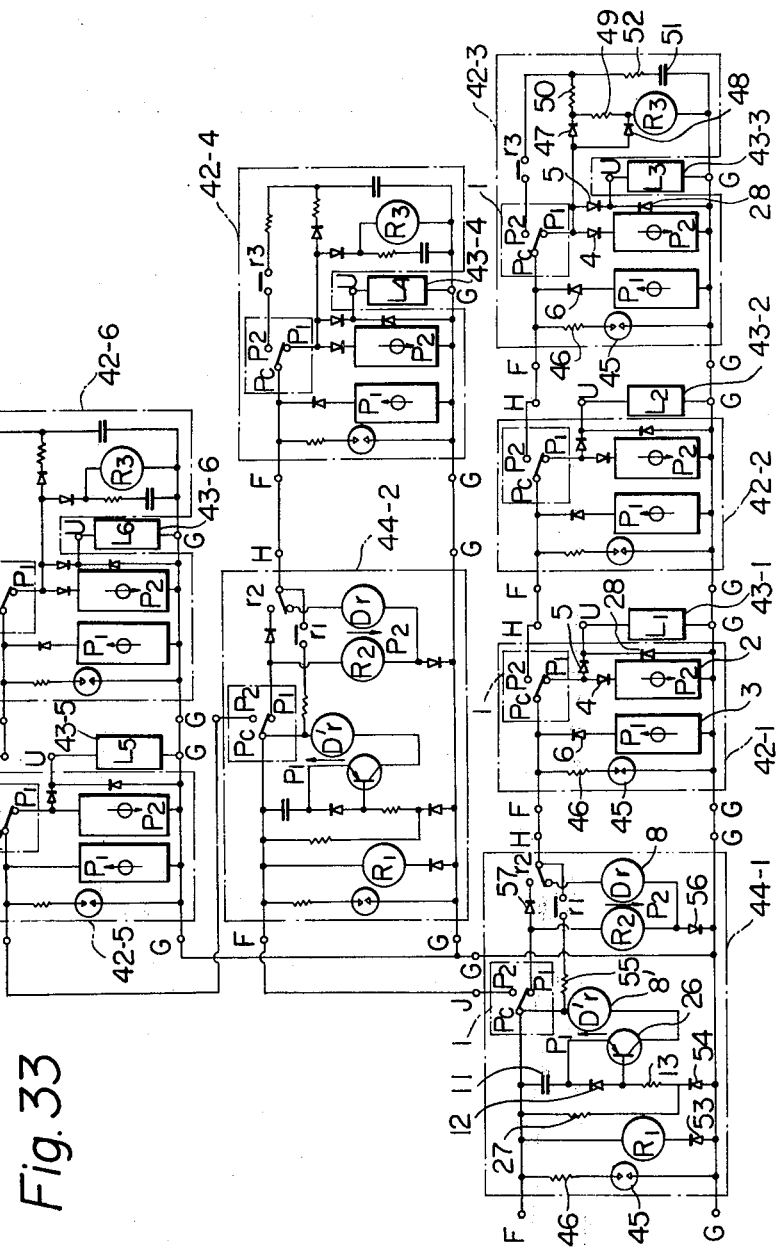
FIG. 33 is a schematic circuit diagram of an embodiment of a sequential switch apparatus wired in a tree wise manner according to the present invention.

FIG. 33 shows a sequential switch apparatus wired in a tree-wise manner and making use of "branching switch devices" 44-1 and 44-2, and "terminal switch devices" 42-3, 42-4 and 42-6 each containing a "terminal signal generator". Switch devices of the present invention may contain an arrester 45 and resistor 46 connected in series therewith for protection, as shown in FIG. 33.

As to branching switch devices 44-1 and 44-2, a relay having a coil $R_2$ and a transfer contact $r_2$ couples the discharge current from capacitor 51 of the associated "terminal signal generator" (i.e., one of devices 42-3, 42-4 and 42-6) to drive element 8 to cause change-over of the common terminal Pc of relay contacts 1 from $P_1$ to $P_2$ when an associated "terminal switch device" has made the same mode of switch-over. Diode 57 prevents the discharge current from bypassing, and diode 56 prevents relay coil $R_2$ and drive element 8 from being energized when negative voltage is applied for reset. Resistor 55 protects associated relay contacts from excess current. Diodes 53 and 54 prevent operation of the relay comprising coil $R_1$ and normally open contact $r_1$, as well as drive circuit for reset, when positive voltage is applied.

As to the terminal signal generators in terminal switch devices 42-3, 42-4 and 42-6, resistors 50 and 52 limit charging current to capacitance 51, and resistor 52 also protects associated circuit components from excess current. The relay having coil $R_3$ and normally open contact $r_3$ provides a path for discharging current from capacitor 51 to an associated branching switch device when the pertaining terminal switch device has made a change-over from $P_1$ to $P_2$. Diodes 47 and 48 block and resistor 49 limits the discharging current from capacitor 51.

In the circuit arrangement of FIG. 33, switch devices 42-1, 42-2, 42-3, 44-1, 42-4, 44-2, 42-5 and 42-6 perform change-over in turn and loads 43-1, 43-2, 43-3, 43-4, 43-5 and 43-6 are sequentially energized as a result of the sequentially applied input pulses.

Figure 34:
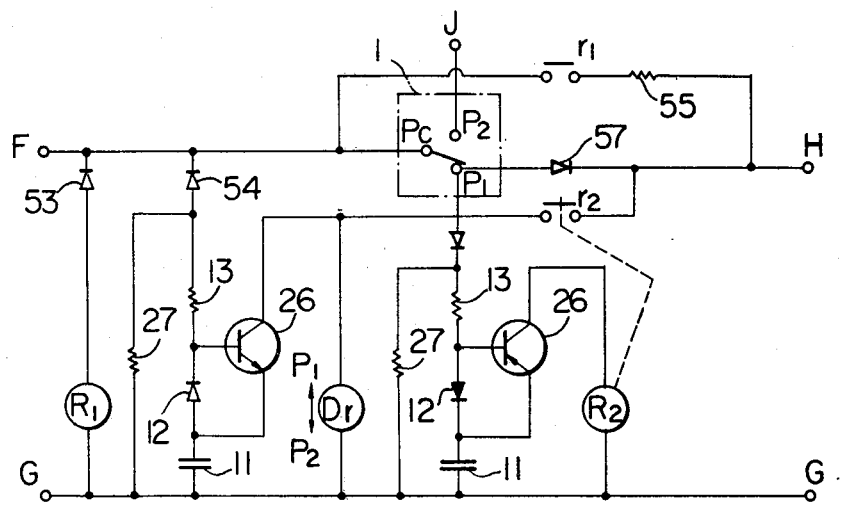
Figure 35:
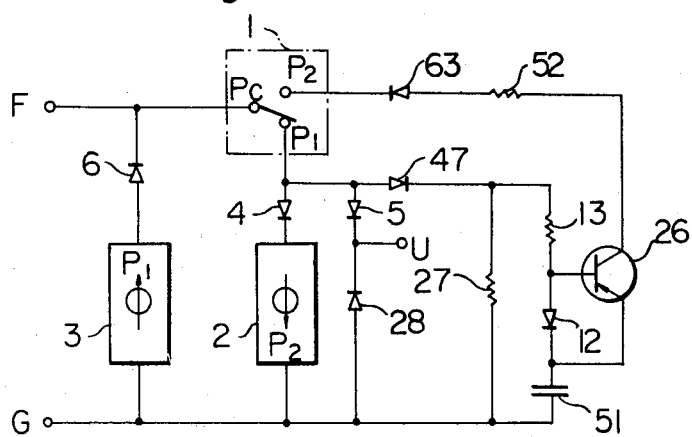

FIGS. 34 and 35 show alternate embodiments of the branching switch devices 44-1 and 44-2 and terminal switch devices 42-3, 42-4 and 42-6 of FIG. 33, respectively.

In the switch device of FIG. 34, a normally open contact replaces the transfer contact of relay $R_2 - r_2$, and a single drive element Dr of dual polarities replaces a pair of separate drive elements of the switching relay in consequence of trailing-edge-triggered drive circuit coupled to relay coil $R_2$.

In the switch device of FIG. 35 a trailing-edge-triggered circuit is employed as the terminal signal generator. Diode 63 blocks current due to externally applied positive voltage.

Figure 36:
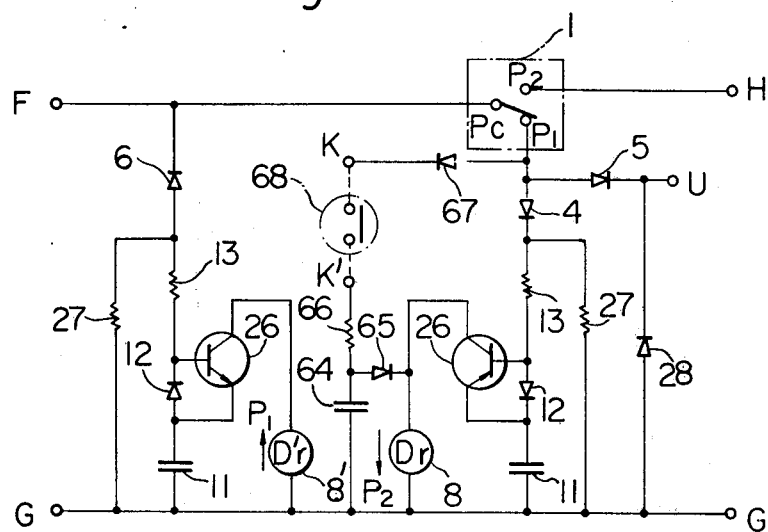
Figure 37:
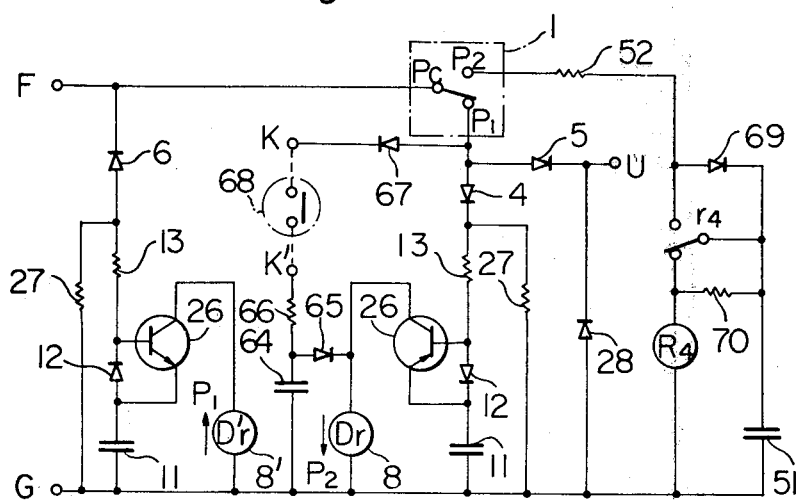

In the switch devices of FIGS. 36 and 37 drive element 8 of the switching relay is subject to both leading-edge-triggered and trailing-edge-triggered drive circuits for change-over from contact terminals $P_1$ to $P_2$. Drive element 8 is energized when an external switch 68 is closed and when external positive voltage is applied to contact $P_1$. Capacitor 64, resistor 66 and diodes 65 and 67 are components of the leading-edge-triggered drive circuit. In FIG. 37 relay $R_4 - r_4$ having coil $R_4$ and transfer contact $r_4$, capacitor 51, resistor 52 and 70, diode 69 form a terminal signal generator.

Figure 38:
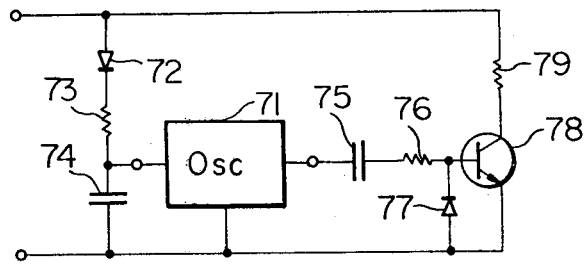
FIG. 38 is a schematic circuit diagram of an embodiment of a pulsating current generator in accordance with the present invention.
Figure 40:
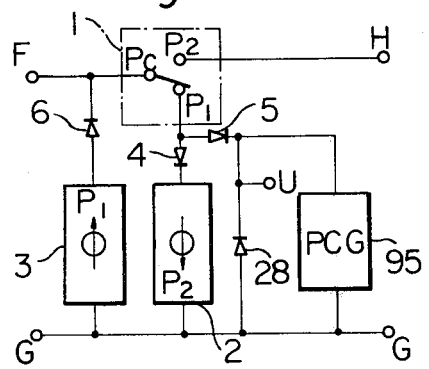
Figure 41:
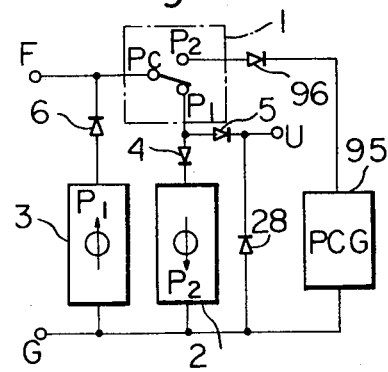

FIG. 38 shows an embodiment of a pulsating current generator that can be incorporated in the switch devices of the present invention. The use of such a pulsating current generator is shown in FIGS. 40 and 41, wherein pulsating current generator 95 may be connected either to terminal U (FIG. 40) or to terminal H through diode 96 (FIG. 41). FIG. 41 shows a terminal switch device that generates a terminal signal in the form of a pulsating current signal. This type of terminal signal does not cause change-over in the branching switch devices of FIGS. 33 and 34.

In FIG. 38 oscillator 71, capacitors 74 and 75, resistors 73, 76 and 79, diodes 72 and 77, and transistor 78 form a pulsating current generator 95 of FIGS. 40 and 41.

Figure 39:
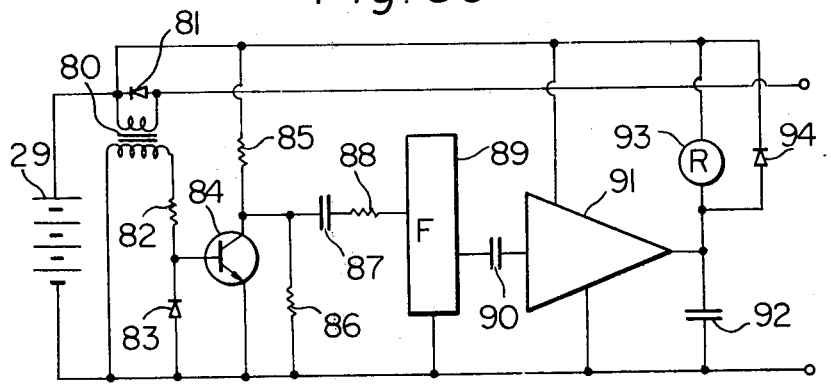
FIG. 39 is a schematic circuit diagram of an embodiment of a tuning relay circuit for selective reception of pulsating current signals.

A tuning relay circuit that receives and responds to a specific frequency of pulsating current is shown in FIG. 39. A transformer 80, diodes 81, 83 and 94, resistor 82, 85, 86 and 88, transistor 84, capacitors 87, 90 and 92, turning fork 89, amplifier 91 and relay 93 form the tuning relay circuit.

FIGS. 42 and 43 show two types of sequential switch apparatus in which each of switch devices 97-1 to 97-4 and 98-1 to 98-4 has a signal source and the signal sources are arranged such that two different signals are generated and sent out alternately in correspondence with operation of the switch devices in a sequential manner. External switches 68 may be pressure switches or flow switches while objective loads may be solenoid valves. The power supply switch circuit may receive information of individual objective loads with their identification.

Figure 44:
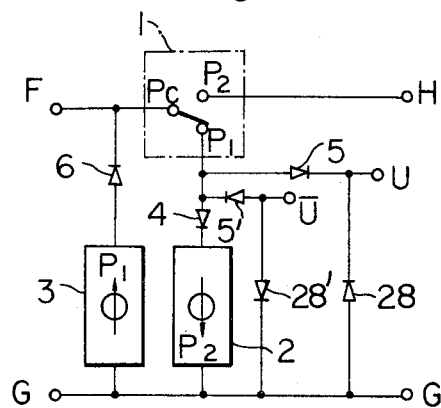
Figure 45:
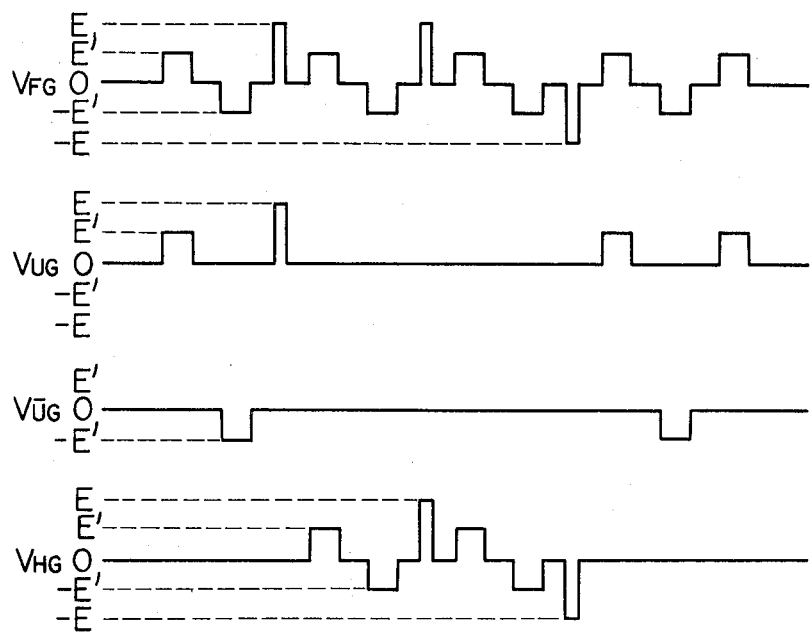
FIG. 45 shows voltage vs. time waveforms corresponding to operation of the embodiments of FIG. 44.

In the switch device of FIG. 44 diodes 5' and 28' connected to output terminal U have opposite polarity to diodes 5 and 28 connected to output terminal U. Referring to the operational characteristics of the circuit of FIG. 44 as shown in FIG. 45, voltage levels E' and −E' are determined such that they sufficiently energize loads but are insufficient to energize both of the drive circuits 2 and 3.

Figure 46:
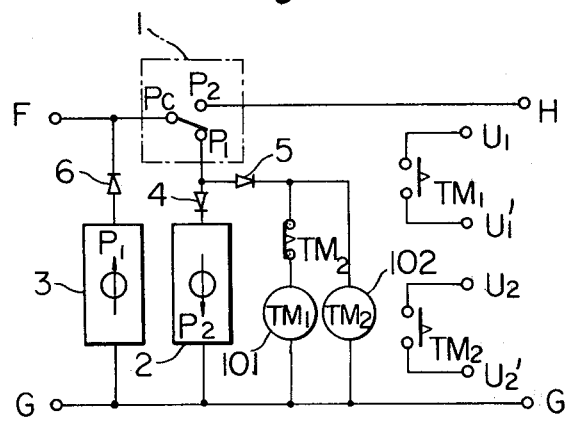
Figure 47:
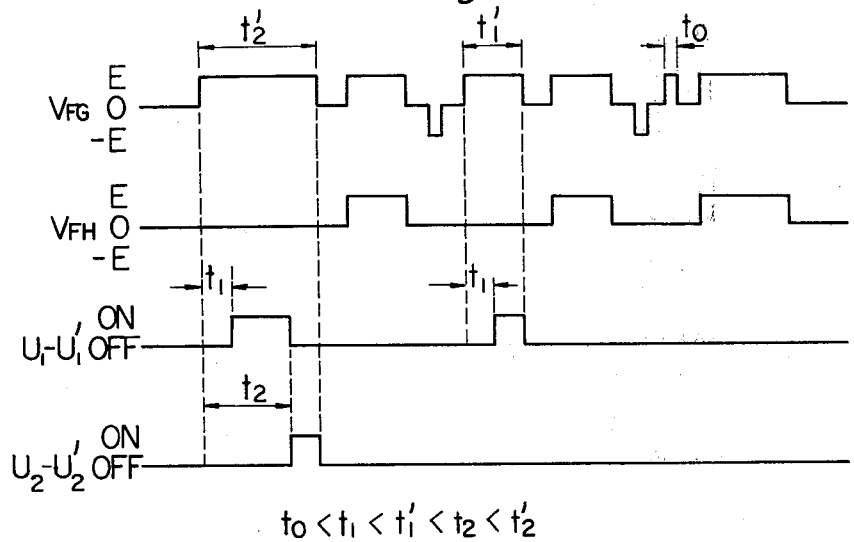
FIG. 47 shows voltage vs. time waveforms corresponding to operation of the embodiments of FIG. 46.

In the switch device of FIG. 46 two timing relays $TM_1$ and $TM_2$ are employed and their timings $t_1$ and $t_2$ are, as shown in FIG. 47, determined such that $t_o < t_1 < t_1' < t_2 < t_2'$. Referring to FIG. 47, both the terminal $U_1 - U_1'$ and $U_2 - U_2'$ are never turned on when voltage E is applied for a length of time $t_o$, only $U_1 - U_1'$ is turned on when voltage E is applied for a length of time $t_1'$, and $U_1 - U_1'$ is turned on first and then $U_2 - U_2'$ is turned on alternately when voltage E is applied for a length of time $t_2'$.

The switch devices of FIGS. 44 and 46 facilitate selective ON-OFF operation of loads, because desired loads are selected by sequential change-over of the switch devices without affecting the loads.

I claim:
1. Switching apparatus including at least one electrical switch device which comprises:
   a bi-stable double-throw switching relay having at least one common contact and a pair of exclusively selectable contacts, said relay further having non-galvanic memory means for the two exclusively selectable contacts;
   at least first and second energy storing means each having sufficient energy storage capacity for driving said relay;
   means coupling said first energy storing means to a first contact of said relay such that: said first energy storing means is charged with energy while said first contact is selected by said common contact of said relay and while said common contact of said relay is coupled to a first pole of a direct-current power source; and the energy thus stored in said first energy storing means is discharged to drive said relay so as to make a change-over of said common contact from the first to the second selectable contact when said common contact is turned off from said power source and
   means coupling said second energy storing means to said relay such that: it is charged with energy while said common contact of said relay is turned on to another pole of said direct-current power source: and such that the energy thus stored in said second energy storing means is discharged to drive said relay so as to make a reverse change-over of said common contact from the second to the first selectable contact when said common contact is turned off from said power source.

2. Apparatus according to claim 1 wherein said at least one electrical switch device comprises an additional circuit including a pair of terminals connected to said first contact of said relay, and including means responsive to short-circuiting of said pair of terminals and to said relay being in a condition such that it is currently holding said first contact and said common contact is turned on to said power source, for driving said relay to make a change-over of said common contact from the first to the second contact upon said shortcircuiting of said pair of terminals.

3. Apparatus according to claim 1 comprising a plurality of said electrical switch devices, and means for interconnecting said electrical switch devices in a chain-wise manner such that the second relay contact of each switch device is connected to the common contact of the next successive switch device, said successive switch devices being operated in sequence responsive to successive input pulse signals.

4. Apparatus according to claim 1 comprising a plurality of said electrical switch devices, and means for interconnecting said electrical switch devices in a plural branch tree-wise manner, at least one branch of said treewise connection comprising a plurality of said electrical switch devices, connected together in a chain-wise manner such that the second relay contact of each switch device is connected to the common contact of the next successive switch device; and further comprising a terminal signal generator at the end of each of said branches and a branching switch device at each branching point; each said terminal signal generator including means for generating a terminal signal responsive to a change-over of the common contact from the first to the second contact of the associated switch device at the end of the associated branch line; and said branching switch device comprising means for carrying out a change-over of a common contact from the first to the second contact upon receipt of said terminal signal from an associated terminal signal generator.

5. Apparatus according to claim 1 wherein at least one of said energy storage means comprises a capacitor.

6. Apparatus according to claim 1 wherein at least one of said energy storage means comprises an inductor.

7. Apparatus according to claim 1 wherein at least one of said energy storage means comprises a capacitor coupled to an inductor.

8. Apparatus according to claim 1 wherein at least one of said energy storage means comprises a drive element of said relay.

9. Apparatus according to claim 1 wherein at least one of said energy storing means comprises at least one energy storing element coupled to the drive element of said relay.

10. Apparatus according to claim 1 wherein at least one of said energy storing means comprises at least one energy storing element and a relay coupled thereto and having a switchable contact coupled across said energy storing element.

11. Apparatus according to claim 1 wherein at least one of said energy storing means comprises at least one energy storing element and a relay coupled thereto and having a switchable contact coupled in series with said energy storing element.

12. Apparatus according to claim 1 wherein at least one of said energy storing means includes an energy storing element and a semiconductor switching means coupled thereacross.

13. Apparatus according to claim 1 wherein at least one of said energy storing means includes an energy storing element and a switching means coupled in series therewith.

14. Apparatus according to claim 1 wherein at least one of said energy storing means comprises a capacitor coupled substantially in parallel with an inductor.

15. Apparatus according to claim 1 comprising a diode coupled in series with at least one of said energy storing means.

16. Apparatus according to claim 1 comprising a diode coupled in series with each of said first and second energy storing means.

17. Apparatus according to claim 16 wherein said diodes are connected to said respective energy storing means with opposite polarities.

18. Apparatus according to claim 1 wherein said second energy storing means is coupled to said common contact of said relay.

19. Apparatus according to claim 1 wherein said second energy storing means is coupled to said second selectable contact of said relay.

20. Apparatus according to claim 1 wherein said second energy storing means is coupled to an external voltage source for resetting of said switching device.

21. Apparatus according to claim 1 wherein said first selectable relay contact is coupled to a load, said common contact is coupled to said direct-current power source as an input signal, and said second selectable contact is coupled to an output terminal which is adapted to be coupled to the input of a next successive electrical switch device.

* * * * *